United States Patent
Anglin et al.

(10) Patent No.: US 11,664,193 B2
(45) Date of Patent: May 30, 2023

(54) TEMPERATURE CONTROLLED/ELECTRICALLY BIASED WAFER SURROUND

(71) Applicant: Applied Materials, Inc., Santa Clara, CA (US)

(72) Inventors: Kevin R. Anglin, Beverly, MA (US); Simon Ruffell, Hamilton, MA (US); Kevin Verrier, Hampton, NH (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 17/167,416

(22) Filed: Feb. 4, 2021

(65) Prior Publication Data
US 2022/0246397 A1 Aug. 4, 2022

(51) Int. Cl.
*H01J 37/305* (2006.01)
*H01J 37/304* (2006.01)
*H01J 37/32* (2006.01)

(52) U.S. Cl.
CPC ........ *H01J 37/3053* (2013.01); *H01J 37/304* (2013.01); *H01J 37/32724* (2013.01);
(Continued)

(58) Field of Classification Search
CPC ...... H01J 37/3053; H01J 37/20; H01J 37/304; H01J 37/32724; H01J 2237/0203;
(Continued)

(56) References Cited

U.S. PATENT DOCUMENTS

| 6,570,171 B2 | 5/2003 | Tomita et al. |
| 8,449,679 B2 | 5/2013 | Dhindsa |

(Continued)

FOREIGN PATENT DOCUMENTS

| CN | 101563751 A | 10/2009 |
| CN | 110268505 A | 9/2019 |

(Continued)

OTHER PUBLICATIONS

International Search Report and Written Opinion dated Jul. 28, 2021 in co-pending PCT application No. PCT/US2021/026991.
(Continued)

*Primary Examiner* — David E Smith
(74) *Attorney, Agent, or Firm* — Nields, Lemack & Frame, LLC

(57) ABSTRACT

A system and method for etching workpieces in a uniform manner are disclosed. The system includes a semiconductor processing system that generates a ribbon ion beam, and a workpiece holder that scans the workpiece through the ribbon ion beam. The workpiece holder includes a portion that extends beyond the workpiece, referred to as a halo. The halo may be independently heated to compensate for etch rate non-uniformities. In some embodiments, the halo may be independently biased such that its potential is different from the potential applied to the workpiece. In certain embodiments, the halo may be divided into a plurality of thermal zones that can be separately controlled. In this way, various etch rate non-uniformities may be addressed by controlling the potential and/or temperature of the various thermal zones of the halo.

19 Claims, 8 Drawing Sheets

(52) U.S. Cl.
CPC .................. *H01J 2237/0203* (2013.01); *H01J 2237/3151* (2013.01)

(58) Field of Classification Search
CPC ............ H01J 2237/3151; H01L 21/20; H01L 21/265; H01L 21/67; H01L 21/683; H01L 21/687
See application file for complete search history.

(56) References Cited

U.S. PATENT DOCUMENTS

| | | | |
|---|---|---|---|
| 10,109,510 B2* | 10/2018 | Anella | H05B 3/265 |
| 10,199,246 B2 | 2/2019 | Koizumi et al. | |
| 10,665,433 B2 | 5/2020 | Likhanskii et al. | |
| 2008/0042078 A1 | 2/2008 | England et al. | |
| 2008/0124903 A1 | 5/2008 | England et al. | |
| 2010/0330787 A1 | 12/2010 | Sferlazzo | |
| 2013/0206337 A1* | 8/2013 | Dhindsa | H01J 37/32577 156/345.28 |
| 2014/0047705 A1 | 2/2014 | Singh et al. | |
| 2014/0265853 A1 | 9/2014 | Radovanov et al. | |
| 2016/0111254 A1* | 4/2016 | Evans | H01J 37/32752 427/523 |
| 2016/0217970 A1 | 7/2016 | Husain et al. | |
| 2016/0225645 A1* | 8/2016 | Koizumi | H01L 21/67103 |
| 2017/0029950 A1 | 2/2017 | Chen et al. | |
| 2018/0211816 A1 | 7/2018 | Buonodono | |
| 2018/0294177 A1* | 10/2018 | Peng | H01J 37/32 |
| 2019/0006587 A1 | 1/2019 | Gilchrist et al. | |
| 2019/0139774 A1 | 5/2019 | Biloiu et al. | |
| 2019/0198298 A1* | 6/2019 | Hirose | H01J 37/32522 |
| 2019/0272983 A1* | 9/2019 | Wallace | H01L 21/67069 |
| 2019/0304820 A1 | 10/2019 | Baggett et al. | |
| 2020/0090972 A1 | 3/2020 | Benjaminson et al. | |
| 2020/0243355 A1 | 7/2020 | Makabe | |
| 2021/0272828 A1 | 9/2021 | Sundaram et al. | |
| 2021/0343550 A1 | 11/2021 | Anglin et al. | |

FOREIGN PATENT DOCUMENTS

| | | |
|---|---|---|
| JP | 10-107134 A | 4/1998 |
| JP | 2007-67037 A | 3/2007 |
| TW | 201447954 A | 12/2014 |
| TW | 201523786 A | 6/2015 |
| TW | 201911410 A | 3/2019 |
| TW | 201943018 A | 11/2019 |
| TW | 201944451 A | 11/2019 |
| TW | 202017077 A | 5/2020 |
| TW | 202025217 A | 7/2020 |
| WO | 2009-058376 A2 | 5/2009 |

OTHER PUBLICATIONS

International Search Report and Written Opinion dated Jun. 7, 2022 in corresponding PCT application No. PCT/US2021/064636.
Office action dated Sep. 21, 2022 in co-pending U.S. Appl. No. 16/865,860.
Notice of Allowance dated Jan. 6, 2023 in co-pending U.S. Appl. No. 16/865,860.

* cited by examiner

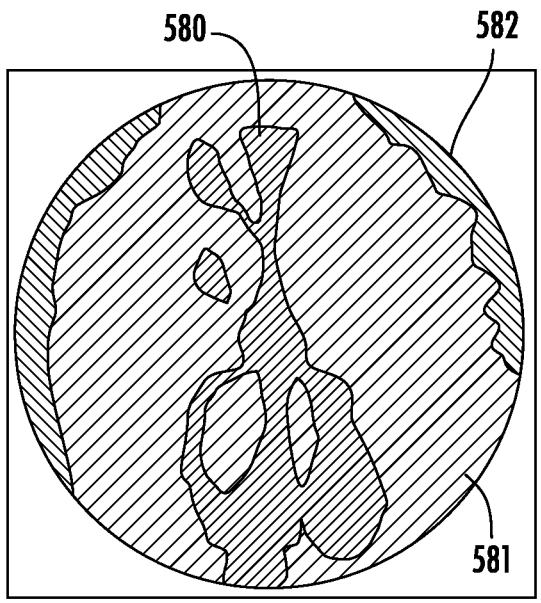 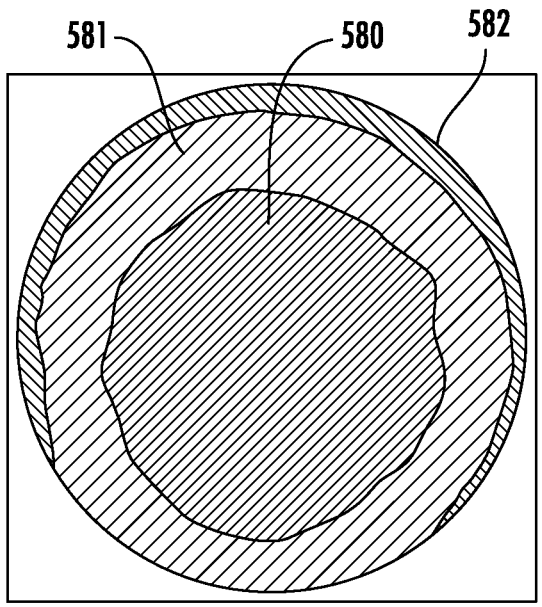
FIG. 5C  FIG. 5D
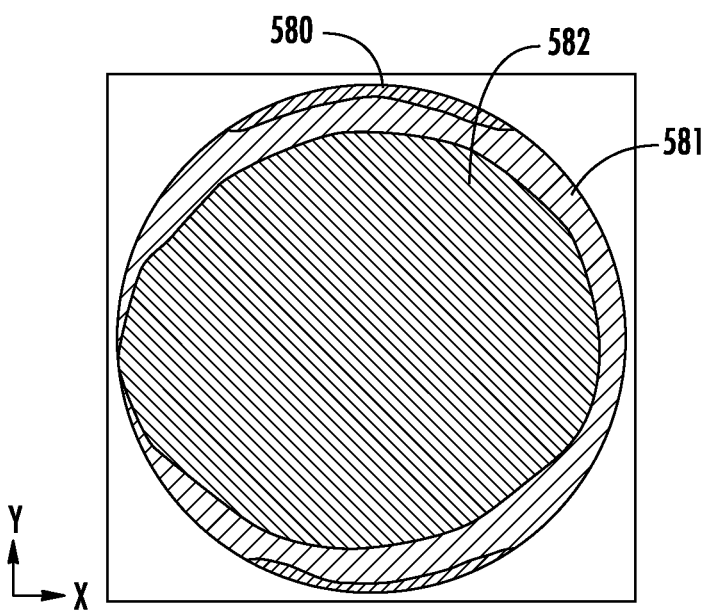
FIG. 5E

TEMPERATURE CONTROLLED/ELECTRICALLY BIASED WAFER SURROUND

FIELD

Embodiments of the present disclosure relate to systems and methods for improving etch rate uniformity, and more particularly improving the etch rate uniformity of a workpiece scanned through a ribbon ion beam.

BACKGROUND

Ion beams may be used to implant dopants, etch material or amorphize workpieces, such as silicon substrates. These ion beams may be created using semiconductor processing system that includes an ion source that generates ions of a desired species. In certain embodiments, these ions are extracted and manipulated by a plurality of components that selects the desired species, and guide the ions toward the workpiece. In other embodiments, the ion source is located proximate to the workpiece and the ions are attracted from the ion source toward the workpiece.

In some implementations, the uniformity of various parameters may need to be tightly controlled. For example, in certain applications, it may be desired that the Width in Wafer (WiW) etch rate be within 3-5% (3 sigma value) or better. However, due to variation in beam current across its width and other phenomena, this may be difficult to achieve.

For example, for ribbon ion beams, it is typical for these ribbon beams to have non-uniform beam current in the X direction, especially at the ends of the ribbon beam.

Further, the workpiece may be disposed on a workpiece holder that passes through the ribbon ion beam. This workpiece holder may include a portion that extends beyond the workpiece. This portion may be referred to as a surround or a halo. Any electrical or thermal discontinuities between the workpiece and the halo may cause variation in the etch rate uniformity.

Therefore, it would be beneficial if there were a system and method for achieving the desired etch rate uniformity using a scanned ribbon ion beam. Further, it would be beneficial if the system was readily adaptable to different etching species.

SUMMARY

A system and method for etching workpieces in a uniform manner are disclosed. The system includes a semiconductor processing system that generates a ribbon ion beam, and a workpiece holder that scans the workpiece through the ribbon ion beam. The workpiece holder includes a portion that extends beyond the workpiece, referred to as a halo. The halo may be independently heated to compensate for etch rate non-uniformities. In some embodiments, the halo may be independently biased such that its potential is different from the potential applied to the workpiece. In certain embodiments, the halo may be divided into a plurality of thermal zones that can be separately controlled. In this way, various etch rate non-uniformities may be addressed by controlling the potential and/or temperature of the various thermal zones of the halo.

According to one embodiment, an etching system is disclosed. The etching system comprises a semiconductor processing system to generate a ribbon ion beam; a workpiece holder; a halo disposed around the workpiece holder; and a scanning motor to move the workpiece holder through the ribbon ion beam, wherein the halo comprises resistive heaters to modify a temperature of the halo. In certain embodiments, the halo comprises an electrically conductive frame and a protective covering disposed on the electrically conductive frame, and the resistive heaters are disposed in or on the protective covering. In certain embodiments, the resistive heaters are disposed on an outer surface of the protective covering facing the electrically conductive frame. In some embodiments, the etching system comprises a temperature sensor disposed on the halo to monitor a temperature of the halo. In certain embodiments, the halo comprises an electrically conductive frame and a protective covering disposed on the electrically conductive frame, and a halo bias power supply to bias the electrically conductive frame at a voltage different from a voltage applied to the workpiece holder. In some embodiments, the halo bias power supply is referenced to the workpiece holder so the halo maintains a constant voltage offset from the workpiece holder. In some embodiments, the halo is electrically isolated from the workpiece holder using an insulating material.

According to another embodiment, an etching system is disclosed. The etching system comprises a semiconductor processing system to generate a ribbon ion beam; a workpiece holder; a halo disposed around the workpiece holder; and a scanning motor to move the workpiece holder through the ribbon ion beam, wherein the halo comprises a plurality of thermal zones to compensate for both radial and linear etch rate non-uniformities. In some embodiments, the halo comprises a frame and a protective covering disposed on the frame, and the resistive heaters are disposed in or on the protective covering. In certain embodiments, the resistive heaters are disposed on an outer surface of the protective covering facing the frame. In some embodiments, the halo is divided into a plurality of thermal zones. In some further embodiments, the plurality of thermal zones may be independently controlled. In some embodiments, the etching system comprises a thermal controller, comprising a plurality of power supplies in communication with the plurality of thermal zones and a controller in communication with the thermal controller, wherein a workpiece type and etching species are input to the controller and the thermal controller supplies power to the plurality of thermal zones to achieve a desired temperature profile. In certain embodiments, the etching system comprises a temperature sensor disposed in at least one thermal zone to monitor a temperature of the at least one thermal zone.

According to another embodiment, an etching system is disclosed. The etching system comprises a semiconductor processing system to generate a ribbon ion beam; a workpiece holder; a halo disposed around the workpiece holder, wherein the halo comprises an electrically conductive frame and a protective covering disposed on an electrically conductive frame; a scanning motor to move the workpiece holder through the ribbon ion beam; and a halo bias power supply to bias the electrically conductive frame at a voltage different from a voltage applied to the workpiece holder. In some embodiments, the halo bias power supply is referenced to the workpiece holder so the halo maintains a constant voltage offset from the workpiece holder. In some embodiments, the halo is electrically isolated from the workpiece holder using an insulating material. In certain embodiments, the electrically conductive frame is divided into a plurality of conductive regions, wherein a voltage applied to each conductive region is independently controlled. In certain embodiments, the etching system comprises a controller in communication with the halo bias power supply, wherein a workpiece type and etching species are input to the controller and the halo bias power supply supplies power to the electrically conductive frame to achieve a desired change in edge etch rate.

BRIEF DESCRIPTION OF THE FIGURES

For a better understanding of the present disclosure, reference is made to the accompanying drawings, which are incorporated herein by reference and in which:

FIGS. 5A-5E show the etch rate maps for various etching species and workpiece types.

DETAILED DESCRIPTION

Figure 1:
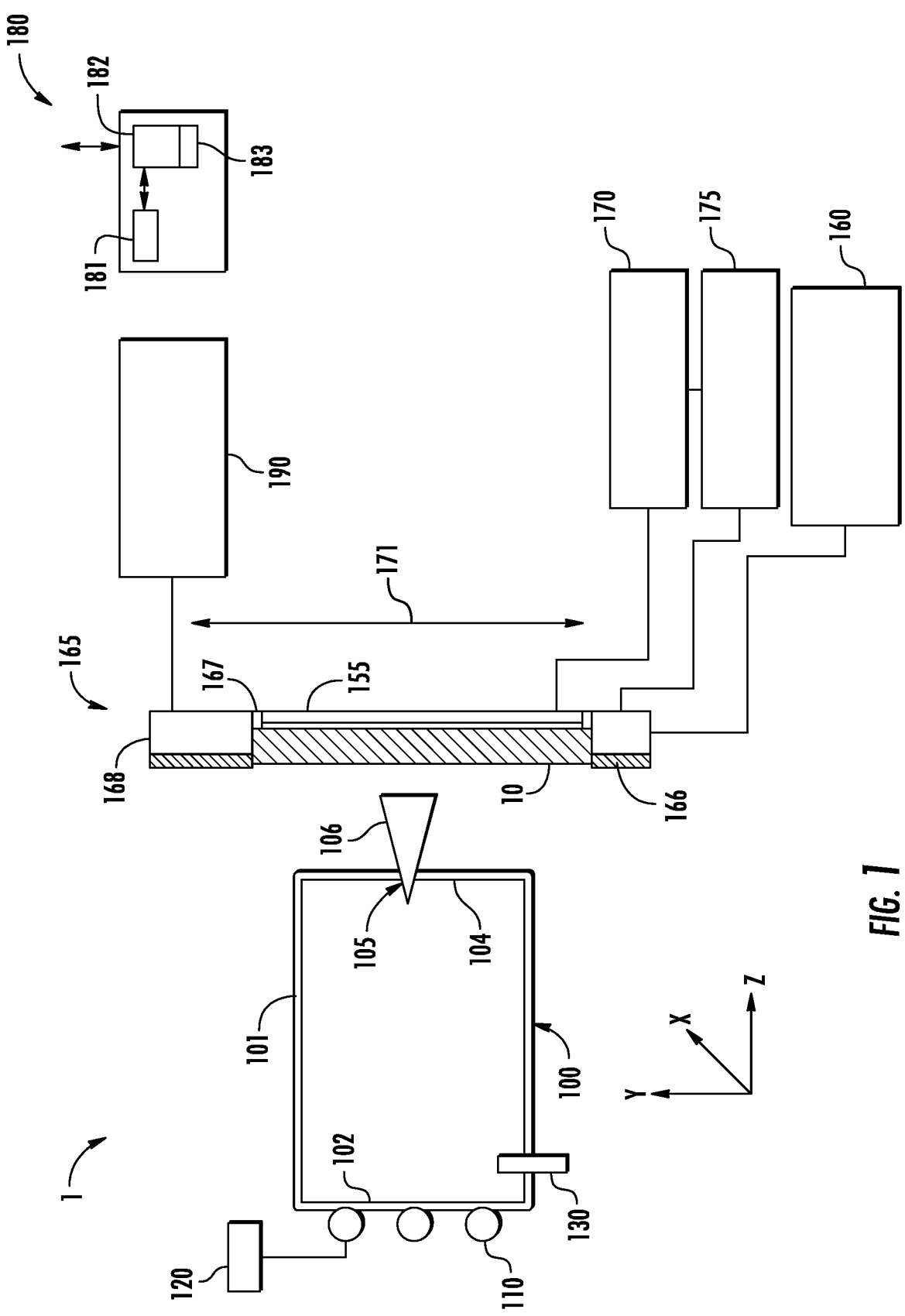
FIG. 1 is a semiconductor processing system in accordance with one embodiment.

As noted above, the present system may be used improve etch rate uniformity in systems that employ a workpiece that is scanned through a ribbon ion beam.

The semiconductor processing system 1 comprises an ion source, which includes an ion source chamber 100, comprised of a plurality of chamber walls 101. In certain embodiments, one or more of these chamber walls 101 may be constructed of a dielectric material, such as quartz. An RF antenna 110 may be disposed on an exterior surface of a first dielectric wall 102. The RF antenna 110 may be powered by a RF power supply 120. The energy delivered to the RF antenna 110 is radiated within the ion source chamber 100 to ionize a feed gas, which is introduced via gas inlet 130.

In other embodiments, the ion source may be an indirectly heated cathode (IHC) ion source, a capacitively coupled plasma source or another type of source.

One chamber wall, referred to as the extraction plate 104 includes an extraction aperture 105 through which an ion beam 106 may exit the ion source chamber 100. The ion beam 106 may be much wider in the horizontal direction, also referred to as the X direction, than the height direction. An ion beam having these characteristics may be referred to as a ribbon ion beam. The extraction plate 104 may be constructed of an electrically conductive material, such as titanium, tantalum or another metal. The extraction plate 104 may be in excess of 300 millimeters in width. Further, the extraction aperture 105 may be wider in the X direction than the diameter of the workpiece 10. This extraction plate 104 may be biased at an extraction voltage. In other embodiments, the extraction plate 104 may be grounded.

In addition to the semiconductor processing system 1, there is a workpiece holder 155. The workpiece holder 155 may be disposed proximate the extraction aperture 105. For example, the workpiece holder 155 may be between 0 and 25 cm from the extraction aperture 105. In certain embodiments, the workpiece holder 155 may be within about 1 cm of the extraction aperture 105.

A workpiece 10 may be disposed on the workpiece holder 155. The workpiece holder 155 is scanned using a scan motor 160, which moves in the vertical direction 171. This direction is also referred to as the Y direction. Thus, the workpiece holder 155 is configured so that there is relative vertical movement between the ion beam 106 and the workpiece holder 155.

The workpiece holder 155 includes an electrostatic clamp that holds the workpiece 10. An electrostatic clamp uses electrostatic forces to retain the workpiece to the workpiece holder 155. The electrostatic clamp may include a base, a dielectric top surface and a plurality of electrodes disposed between the base and the dielectric top surface. Varying voltages may be applied to the electrodes to generate the desired electrostatic forces.

A halo 165 surrounds the electrostatic clamp and the workpiece 10 and has an opening in its center, which corresponds to the location of the workpiece holder 155. The halo 165 comprises a frame 168, which may be constructed of an electrically conductive material, such as a metal. The frame 168 may be made of titanium, aluminum or another material. In certain embodiments, the frame 168 may be nickel plated aluminum, anodized aluminum, or nickel. In certain embodiments, the frame 168 may be rectangular in shape, with a circular cut out to accommodate the workpiece holder 155. For example, the frame 168 may be about 600 mm wide and 1000 mm tall, with a circular opening having a diameter of about 300 mm. In other embodiments, the frame 168 may be circular or another shape.

In addition, the halo 165 may include a protective covering 166, which may be disposed on the front surface of the frame 168. The protective covering 166 protects the frame 168 from exposure to ions, extending the life of the frame 168 and minimizing contamination of the workpiece 10. The protective covering 166 may be a dielectric material or a silicon substrate affixed to the front surface of the frame 168. In one particular embodiment, a plurality of silicon tiles are disposed on the frame 168 and serve as the protective covering 166. The protective covering 166 may be any desired thickness, such as about 3 mm. The protective covering 166 may be dimensioned to cover the entirety of the frame 168.

The workpiece holder 155 may be biased using a workpiece bias power supply 170. In certain embodiments, the output from the workpiece bias power supply 170 is a pulsed DC voltage, having a frequency of between 5 kHz and 50 kHz and an amplitude of 100 to 5,000 volts.

The halo 165 may be independently biased using halo bias power supply 175. For example, the frame 168 may be in communication with the halo bias power supply 175. The output from the halo bias power supply 175 may also be a pulsed DC voltage, having a frequency of between 5 kHz and 50 kHz and an amplitude of 100 to 5,000 volts.

In certain embodiments, the halo bias power supply 175 is referenced to the workpiece bias power supply 170, such that the halo 165 is at a constant voltage offset from the workpiece holder 155. For example, in this embodiment, the output of the halo bias power supply 175 may be set to a constant DC voltage.

Figure 2A:
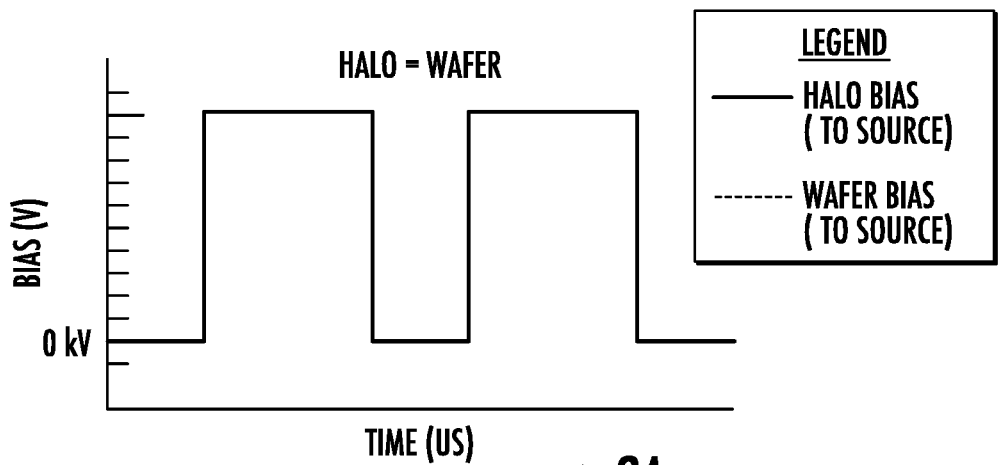
FIGS. 2A-2C show three embodiments using a halo bias power supply.
Figure 2B:
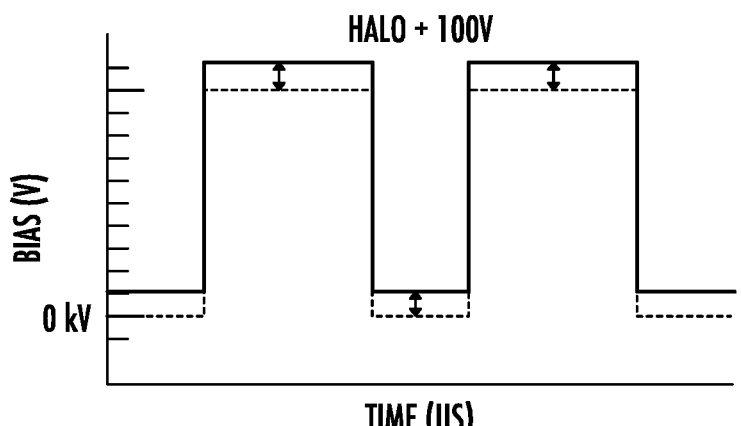
Figure 2C:
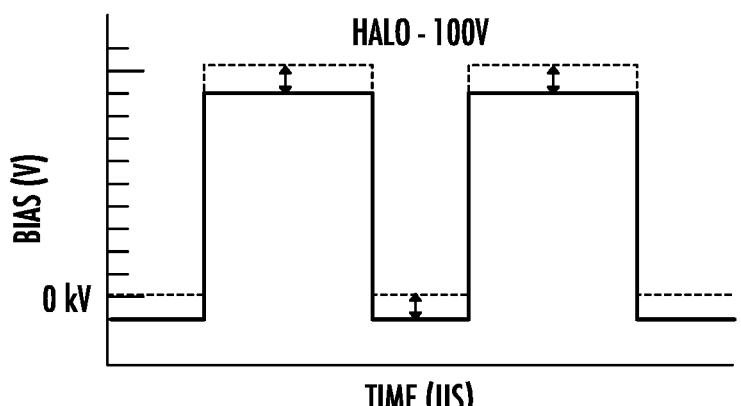

For example, FIGS. 2A-2C show three different embodiments. FIG. 2A shows an embodiment where the halo 165 is always at the same voltage as the workpiece holder 155. This may be achieved by setting the halo bias power supply 175, which is referenced to the workpiece bias power supply 170, to 0 volts. In FIG. 2B, the halo 165 is always at a positive offset relative to the workpiece holder 155. This may be achieved by setting the halo bias power supply 175, which is referenced to the workpiece bias power supply 170, to a positive voltage. In FIG. 2C, the halo 165 is always at a negative offset relative to the workpiece holder 155. This may be achieved by setting the halo bias power supply 175, which is referenced to the workpiece bias power supply 170, to a negative voltage. The halo bias power supply 175 may be capable of supplying voltages between −500V and +500V, relative to the workpiece holder 155. In this way, the bias of the halo 165 relative to the ion source chamber 100 is the sum of voltages supplied by halo bias power supply 175 and workpiece bias power supply 170, in some embodiments.

In other embodiments, the halo bias power supply 175 may be referenced to ground and the output of the halo bias power supply 175 may be in phase with the workpiece bias power supply 170, such that the pulses from the two power supplies are synchronous. Further, in certain embodiments, the output of the halo bias power supply 175 differs from the workpiece bias power supply 170 only during these pulses.

While the above disclosure describes the output from the workpiece bias power supply 170 as being a pulsed DC voltage, it is understood that the workpiece bias power supply 170 may be constant, while an extraction voltage power supply, which biases the extraction plate 104, provides a pulsed DC output. In this embodiment, the halo bias power supply 175 may maintain a constant voltage.

To apply different voltages to the workpiece holder 155 and the halo 165, there may be an electrically insulating material 167 disposed between these two components to electrically isolate the workpiece holder 155 from the frame 168. Materials, such as PEEK, may be used to provide this electrical insulation.

Note that if the frame 168 and the workpiece holder 155 are always maintained at the same voltage, the electrically insulating material 167 may not be utilized.

When pulsed, the voltage applied to the workpiece holder 155 is more negative than the voltage applied to the extraction plate 104. In other words, if the extraction plate 104 is grounded, the workpiece bias power supply 170 generates negative pulses. During these negative pulses, positive ions are attracted from the interior of the ion source chamber 100 to the workpiece 10. If the extraction plate 104 is positively biased, the workpiece bias power supply 170 generates less positive or negative pulses, such that positive ions are attracted from the interior of the ion source chamber 100 to the workpiece 10 during these pulses.

Further, while FIG. 1 shows a single halo bias power supply 175, in certain embodiments, the halo 165 may be divided in several conductive regions, where each conductive region may be independently controlled. For example, the frame 168 may be a plurality of electrically conductive structures that are separated from one another using electrically insulating material 167. Thus, in this embodiment, certain portions of the halo 165 may be at a voltage that is greater than the workpiece holder 155, while other portions of the halo 165 may be at the same voltage or a lower voltage than the workpiece holder 155. Additionally, in this embodiment, certain portions of the halo 165 may be at a voltage that is lower than the workpiece holder 155, while other portions of the halo 165 may be at the same voltage or a higher voltage than the workpiece holder 155. As described below, the selection of the voltage to apply to each segment of the halo 165 may be based on the etching species that is employed.

A thermal controller 190 may also be in communication with the halo 165. The thermal controller 190 may comprise a plurality of power supplies, which supply a voltage or current to each of the plurality of thermal zones in the halo 165, as described in more detail below.

A controller 180 may be in communication with the workpiece bias power supply 170, the halo bias power supply 175, the workpiece holder 155, the thermal controller 190 and other components. The controller 180 may include a processing unit 181, such as a microcontroller, a personal computer, a special purpose controller, or another suitable processing unit. The controller 180 may also include a non-transitory storage element 182, such as a semiconductor memory, a magnetic memory, or another suitable memory. This non-transitory storage element 182 may contain instructions 183 and other data that allows the controller 180 to perform the functions described herein. The controller 180 may be capable of controlling the movement of the workpiece holder 155 via scan motor 160. The controller 180 may be capable of controlling the temperature and voltage of the halo 165 via the thermal controller 190 and halo bias power supply 175, respectively.

There may be two types of etch rate non-uniformity. The first, referred to as radial non-uniformity, is the result of discontinuities at the edge of the workpiece. These discontinuities may be chemical, thermal or electrical. For example, as described with respect to FIG. 1, there may be a halo 165, which comprises a frame 168 and a protective covering 166, around the workpiece 10. If the material used to construct the halo 165 is more resistant to chemical etching than the workpiece, there may be a surplus of etching species available at this interface that can lead to faster etching of the outer edge of the workpiece. Conversely, if the material used to construct the halo 165 is less resistant to chemical etching than the workpiece, the halo 165 may serve as a sink and there may be a deficit of etching species available at this interface that can lead to slower etching of the outer edge of the workpiece. If the dielectric constant of the halo 165 is different from the workpiece, there may be a distortion of the electrical fields at the edge of the workpiece. This distortion may attract or repel ions from the edge of the workpiece 10 as the extraction bias is pulsed. Additionally, if the halo 165 is colder than the workpiece, it may collect deposition at a faster rate from polymerizing gas chemistries, which may also affect the etch rate at the edge of the workpiece.

The second type of non-uniformity is referred to linear non-uniformity. As stated above, the workpiece 10 is scanned in the Y direction through a ribbon ion beam. Often, the beam current profile of the ribbon in the X direction is not constant. Rather, often, the current profiles near the ends of the ribbon ion beam may be lower or greater than the current profile near the center of the ribbon ion beam.

Figure 3:
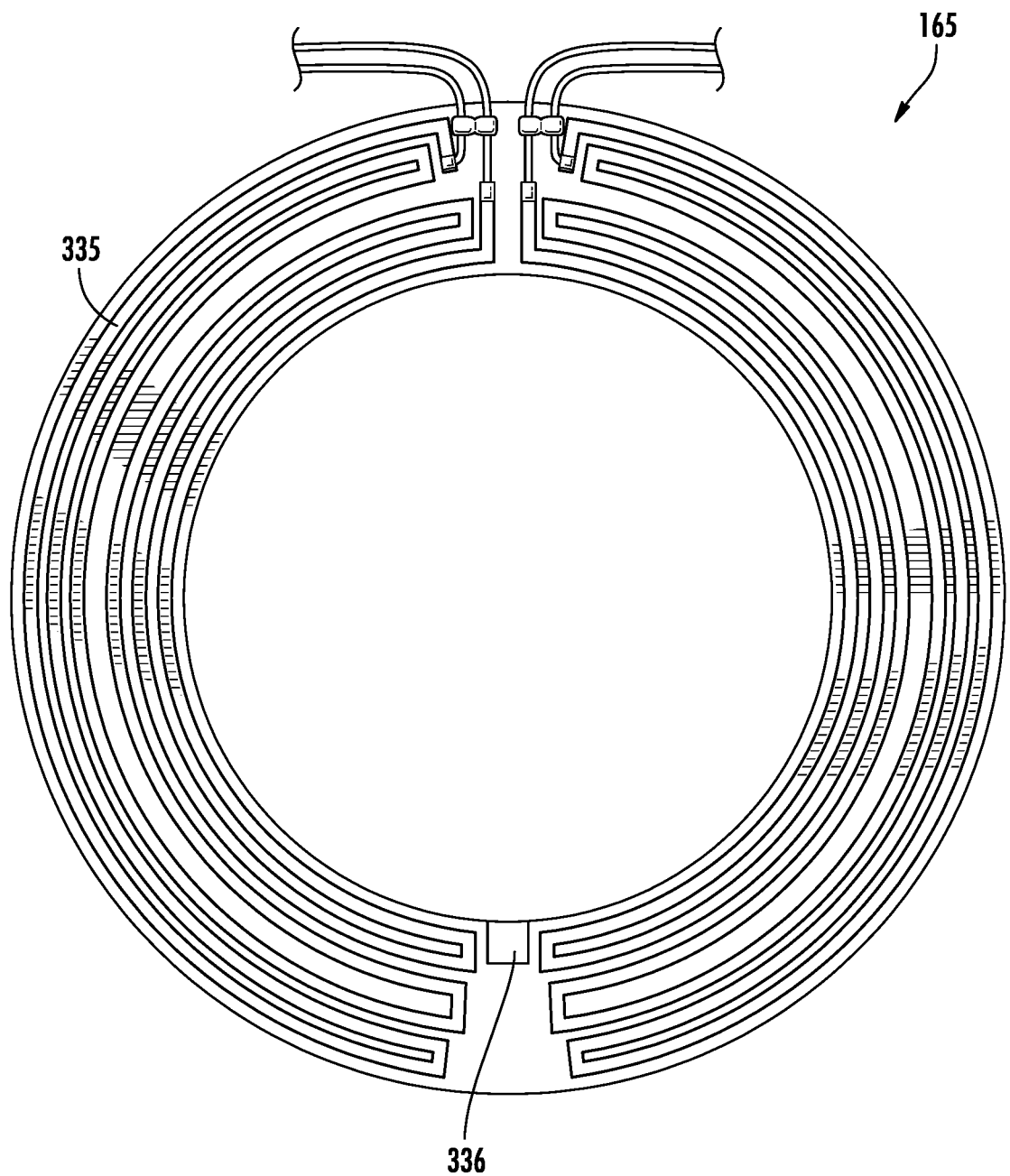
FIG. 3 shows the resistive heater according to one embodiment.

As shown in FIG. 3, the temperature of the halo 165 may be controlled by the placement of resistive heaters 335 on a surface of the halo 165, or embedded within the halo 165. When disposed on a surface, the resistive heaters 335 may be disposed on a back surface of the protective covering 166 that faces the frame 168, so as not to be exposed to the ion beam 106.

In certain embodiments, the resistive heaters 335 may comprise a pattern deposited on a surface of the halo 165. For example, the resistive heaters 335 may be a nickel chromium (NiCr) pattern deposited on the back surface of the protective covering 166. This pattern may then be coated with an insulating material, such as a polyimide spray coating or Kapton tape, to insulate it from the frame 168. Of course, the resistive heaters may be implemented in other ways. In this embodiment, the pattern is disposed between the protective covering 166 and the frame 168. Further, in certain embodiments, the resistive heaters 335 may be disposed in or embedded in the protective covering 166.

In other embodiments, the resistive heaters 335 may be disposed on the back surface of the frame 168, and electrically insulated from the frame 168. In each of these embodiments, the resistive heater 335 may be disposed in a location that allows the heating of the halo 165, while not exposing the resistive heaters 335 to the ion beam 106.

In certain embodiments, the ends of the resistive heater 335 are in communication with a power supply that is part of the thermal controller 190, such as a DC or AC power supply. For example, a 208 VAC power supply, capable to producing up to 10A may be used for each resistive heater 335. Of course, other power supplies, such as a 120 VAC power supply or a DC power supply, may also be used. In some embodiments, the resistive heater 335 is disposed as close to the inner diameter as possible, so as to affect the temperature of the halo 165 near the workpiece 10.

A temperature sensor 336, such as a thermocouple or thermistor, may also be disposed on the back surface of the halo 165. The temperature sensor 336 may be in communication with the thermal controller 190, which regulates the voltage and/or current supplied to the resistive heaters 335 based on the temperature measured by the temperature sensor 336. In another embodiment, open loop control may be employed such that the temperature sensor 336 is not used.

FIG. 3 shows two resistive heaters 335; one on the left side creating a first thermal zone and a second one on the right side creating a second thermal zone. However, the disclosure is not limited to this embodiment. Further, while FIG. 3 shows the resistive heater 335 as a serpentine pattern, other patterns may also be used. The halo 165 may be segmented into any number of thermal zones. In certain embodiments, the resistive heaters 335 may be capable of raising the temperature of a thermal zone by up to 100° C.

Figure 4:
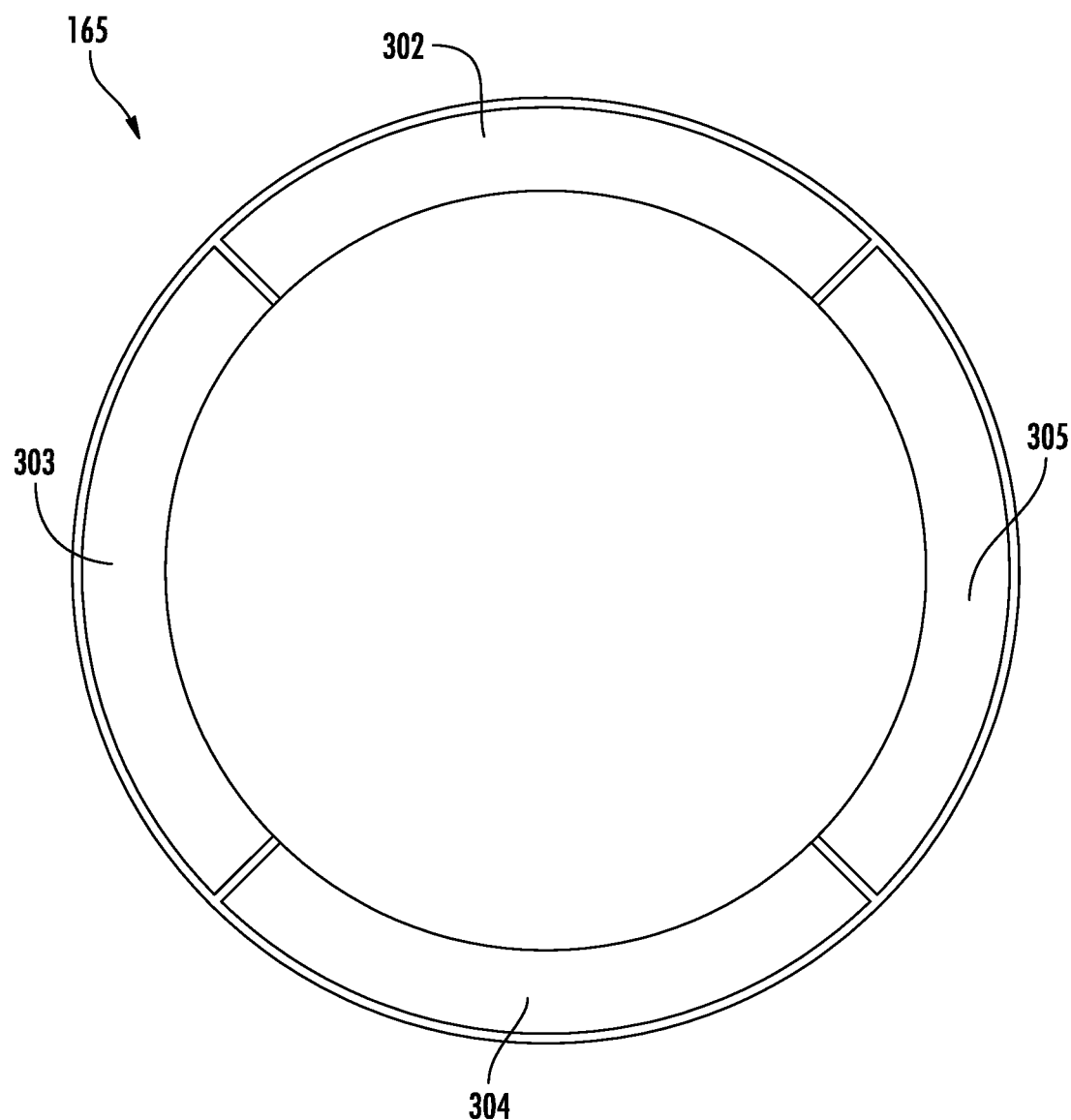
FIG. 4 is a first embodiment of a halo with multiple thermal zones.

For example, as shown in FIG. 4, the halo 165 may be divided into four thermal zones 302, 303, 304, 305. Each thermal zone includes an independently controlled resistive heater 335. Optionally, each thermal zone may include a dedicated temperature sensor 336 so as to control the temperature of each thermal zone independently. By utilizing four thermal zones, both radial non-uniformities and linear non-uniformities may be addressed, as described below.

For example, the boundaries between the thermal zones in FIG. 4 are at 45°, 135°, 225° and 315°. However, other sizes are also possible. For example, the two thermal zones 302, 304 may be larger or smaller than the other two thermal zones 303, 305. For example, if the two thermal zones 302, 304 are to be larger than the other two thermal zones, the boundaries between the thermal zones may be at 60°, 120°, 240° and 300°. Similarly, if the two thermal zones 302, 304 are to be smaller than the other two thermal zones, the boundaries between the thermal zones may be at 30°, 150°, 210° and 330°.

In certain embodiments, each of these thermal zones 302-305 may be independently controlled. In other embodiments, two or more thermal zones may be commonly controlled. For example, the two thermal zones 303, 305, which correspond to the locations where the ends of the ribbon ion beam strike the workpiece, may be commonly controlled. Similarly, the other two thermal zones 302, 304 may be commonly controlled.

FIG. 5A-5E shows etch rate maps for five different combinations of etching species and workpiece type. These etch rate maps are created by measuring a thickness of the workpiece at a plurality of locations prior to the etching operation and measuring the thickness of those same locations after the etching operation. Regions 580 are etched to a greater extent than the other regions. Regions 582 are etched to a lesser extent than the other regions. Regions 581 are those areas where the etch rate lies between these two extremes.

Figure 5A:
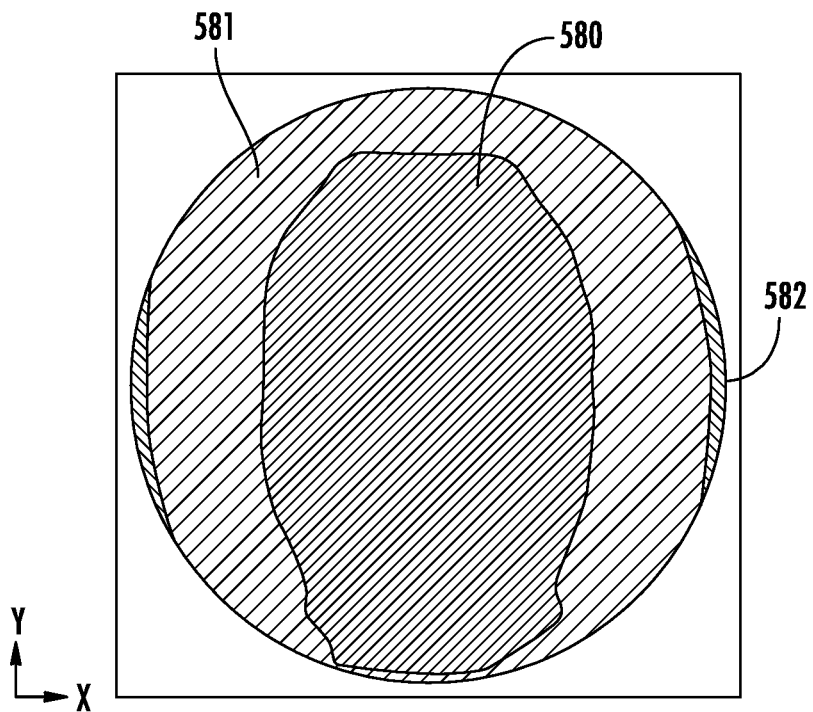
Figure 5B:
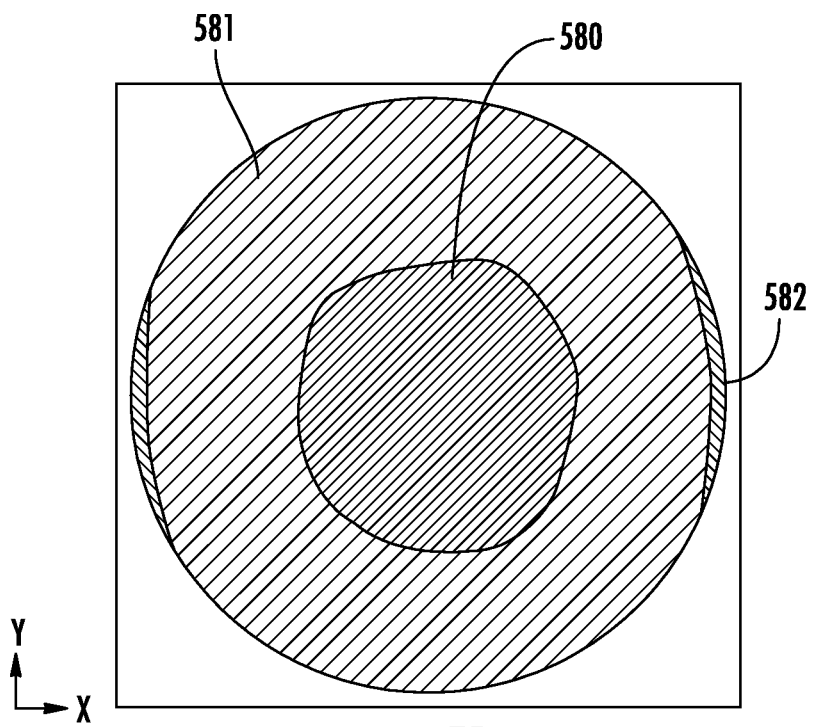

Note that each of these etch rate maps displays radial non-uniformity, linear non-uniformity, or a superposition of the two types of non-uniformity. Specifically, FIGS. 5A and 5C show predominantly linear non-uniformity. FIGS. 5B and 5D show predominantly radial non-uniformity. FIG. 5E shows both types of non-uniformity. Specifically, in FIG. 5E, there is radial non-uniformity that causes the outer edge to be etched more than the center of the workpiece. Additionally, there is linear non-uniformity that causes the ends of the ribbon ion beam to etch less than the center of the ion beam. When these two non-uniformities are combined, only the top and bottom edges of the workpiece are etched more than the rest of the workpiece.

Figure 6A:
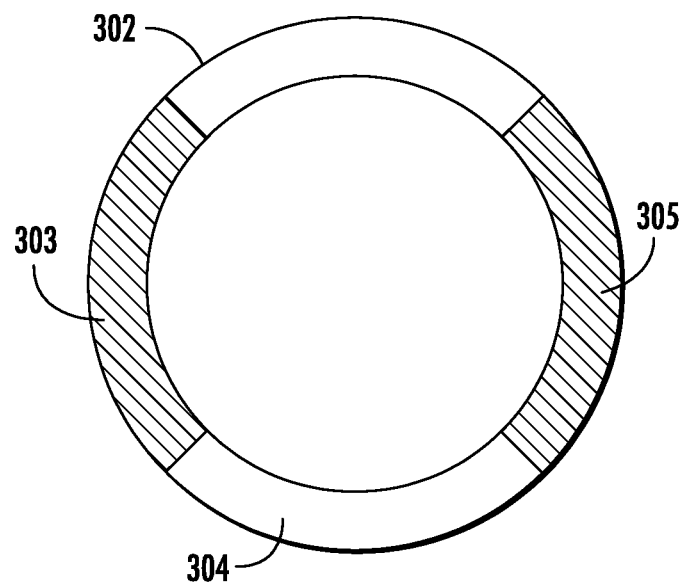
FIGS. 6A-6E illustrate the heating patterns for the halo of FIG. 4 for the various etch rate maps.
Figure 6B:
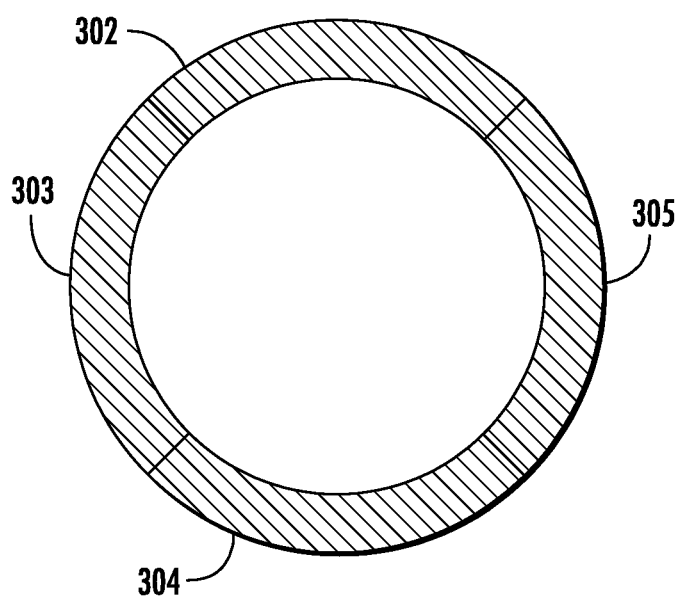
Figure 6C:
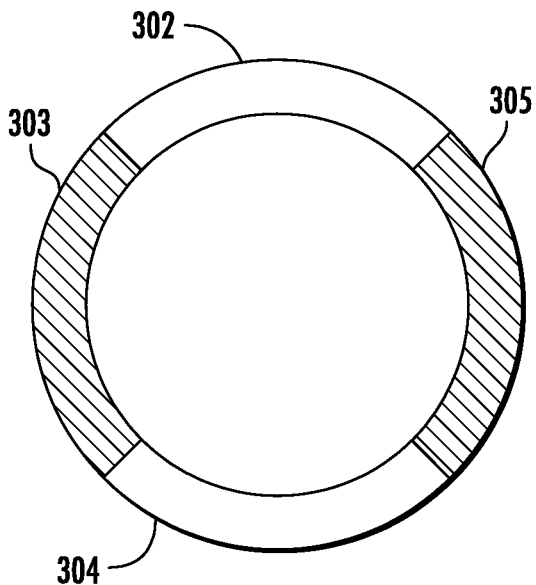

FIGS. 6A-6E show the temperature profile that may be used to compensate for the etch rate maps corresponding to FIGS. 5A-5E, respectively. Note that in FIGS. 5A and 5C, the etch rate along the left and right edges is less than other locations on the workpiece. Thus, in this situation, as shown in FIGS. 6A and 6C, the thermal zones 303, 305 are set to a different temperature than the other thermal zones. For many workpieces and etching species, etch rate is directly proportional to temperature. Thus, to increase the etch rate along the left and right edges of the workpiece, the thermal zones 303, 305 are set to a higher temperature than the other thermal zones. Of course, it is possible for some etch chemistries that etch rate has an inverse relationship with temperature. In this case, to increase the etch rate along the left and right edges of the workpiece, the thermal zones 303, 305 are set to a lower temperature than the other thermal zones.

Figure 6D:
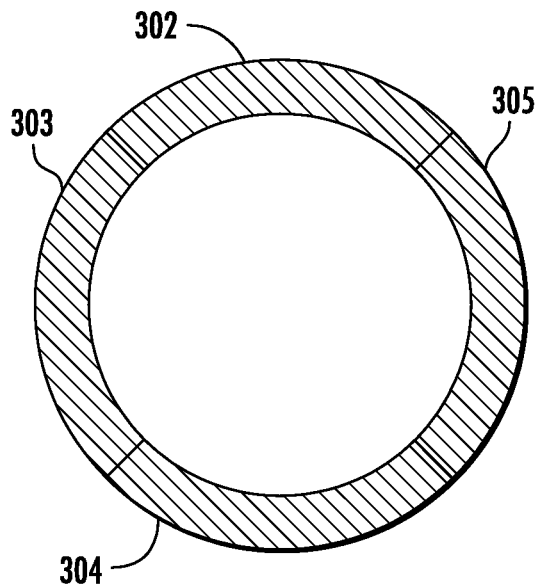

FIGS. 5B and 5D show a radial non-uniformity, where the outer edge has a lower etch rate than the rest of the workpiece. In these cases, as shown in FIGS. 6B and 6D, all of the thermal zones 302-305 are maintained at a different temperature. If etch rate is directly proportional to temperature, then thermal zones 302-305 are set to a higher temperature than the workpiece. If etch rate is inversely proportional to temperature, then thermal zones 302-305 are set to a lower temperature than the workpiece.

Figure 6E:
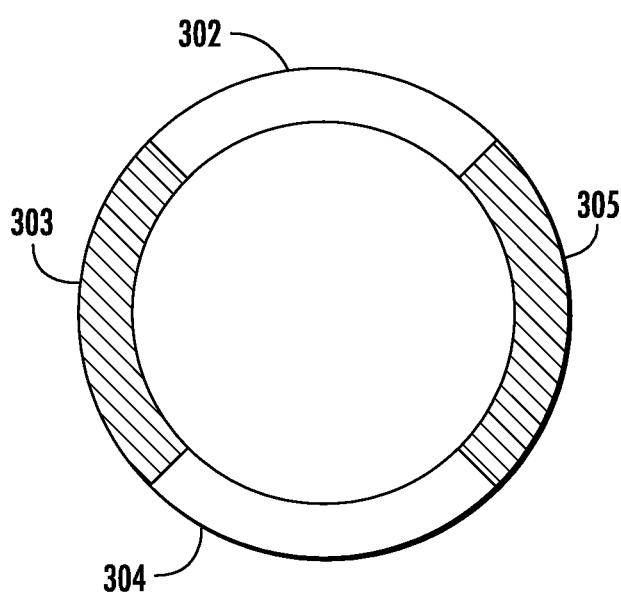

FIG. 5E shows an example where the top and bottom edges of the workpiece have a higher etch rate than the rest of the workpiece. Thus, as shown in FIG. 6E, if etch rate is directly proportional to temperature, then thermal zones 302, 304 are set to a lower temperature than the rest of the thermal zones. If etch rate is inversely proportional to temperature, then thermal zones 302, 304 are set to a higher temperature than the rest of the thermal zones.

Thus, the halo 165 of FIG. 4 may be used to compensate for both radial non-uniformity and linear non-uniformity.

Thus, in one embodiment, the controller 180 receives information about the etching species being used as well as the type of workpiece. This information may be entered via an input device, such as a keyboard or touchscreen. Based on this information, the controller 180 instructs the thermal controller 190 of the desired temperature of each of the thermal zones in the halo 165. The thermal controller 190 then supplies the power to each thermal zone to achieve the desired temperature profile.

The thermal controller 190 may be implemented in a number of ways. In one embodiment, each thermal zone in the workpiece holder has a corresponding dedicated power supply. In other embodiments, certain thermal zones may always be set to the same temperature. In these embodiments, a single power supply may be used to supply power to more than one thermal zone.

In another embodiment, thermal controller 190 may have one power supply for each power level. The outputs of these power supplies are used as the inputs to a plurality of switches or multiplexers, where each switch is used to select which output is applied to each thermal zone.

Further, since the halo 165 is also in communication with a halo bias power supply 175, etching patterns may be modified by manipulating the voltage applied to the halo 165. For example, as noted above, the etch rate pattern of FIGS. 5B and 5D show a radial non-uniformity. This may be corrected by applying a voltage to the halo 165 that is different from the voltage applied to the workpiece holder 155.

In these embodiments, the controller 180 receives information about the etching species being used as well as the type of workpiece. This information may be entered via an input device, such as a keyboard or touchscreen. Based on this information, the controller 180 instructs the halo bias power supply 175 of the voltage to be applied to achieve the desired change in edge etch rate.

Finally, in certain embodiments, it may be possible to utilize both voltage and temperature manipulation of the halo to address non-uniformities. For example, the controller 180 may alter the voltage applied to the halo 165 to compensate for a radial non-uniformity, while the controller 180 may utilize different thermal zones to compensate for a linear non-uniformity.

The embodiments described above in the present application may have many advantages. As noted above, certain processes utilize very tight tolerances for etch rate across the entire workpiece, such as a 3 sigma value of 3% or less.

By manipulating the voltage of the halo 165, the etch rate along the edge of the workpiece may be varied. For example, in one test, a voltage of 100V was output by the halo bias power supply 175. The etch rate along the edge of the workpiece was changed by 2%, as compared to an etch process where the halo remained at the same voltage as the workpiece holder 155. Higher output voltages from the halo bias power supply 175 may result in larger changes in the etch rate along the edge of the workpiece.

Similarly, by manipulating the temperature of various regions of the workpiece, the etch rate associated with each region may be altered so as to achieve a more uniform result across the entire workpiece.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An etching system, comprising:
   a semiconductor processing system to generate a ribbon ion beam;
   a workpiece holder;
   a halo disposed around the workpiece holder, wherein the halo comprises an electrically conductive frame with an opening to accommodate the workpiece holder, and a protective covering disposed on the electrically conductive frame; and
   a scanning motor to move the workpiece holder through the ribbon ion beam,
   wherein the halo comprises resistive heaters to modify a temperature of the halo.

2. The etching system of claim 1, wherein the resistive heaters are disposed in or on the protective covering.

3. The etching system of claim 2, wherein the resistive heaters are disposed on an outer surface of the protective covering facing the electrically conductive frame.

4. The etching system of claim 1, comprising a temperature sensor disposed on the halo to monitor a temperature of the halo.

5. The etching system of claim 1, comprising a halo bias power supply to bias the electrically conductive frame at a voltage different from a voltage applied to the workpiece holder.

6. The etching system of claim 5, wherein the halo bias power supply is referenced to the workpiece holder so the halo maintains a constant voltage offset from the workpiece holder.

7. The etching system of claim 5, wherein the halo is electrically isolated from the workpiece holder using an insulating material.

8. An etching system, comprising:
   a semiconductor processing system to generate a ribbon ion beam;
   a workpiece holder;
   a halo disposed around the workpiece holder, wherein the halo comprises an electrically conductive frame with an opening to accommodate the workpiece holder, and a protective covering disposed on the electrically conductive frame; and
   a scanning motor to move the workpiece holder through the ribbon ion beam,
   wherein the halo comprises a plurality of thermal zones to compensate for both radial and linear etch rate non-uniformities.

9. The etching system of claim 8, wherein resistive heaters are disposed in or on the protective covering.

10. The etching system of claim 9, wherein the resistive heaters are disposed on an outer surface of the protective covering facing the frame.

11. The etching system of claim 8, wherein the halo is divided into a plurality of thermal zones.

12. The etching system of claim 11, wherein the plurality of thermal zones may be independently controlled.

13. The etching system of claim 11, further comprising a thermal controller, comprising a plurality of power supplies in communication with the plurality of thermal zones and a controller in communication with the thermal controller, wherein a workpiece type and etching species are input to the controller and the thermal controller supplies power to the plurality of thermal zones to achieve a desired temperature profile.

14. The etching system of claim 13, further comprising a temperature sensor disposed in at least one thermal zone to monitor a temperature of the at least one thermal zone.

15. An etching system, comprising:
   a semiconductor processing system to generate a ribbon ion beam;
   a workpiece holder;

a halo disposed around the workpiece holder, wherein the halo comprises an electrically conductive frame and a protective covering disposed on the electrically conductive frame;

a scanning motor to move the workpiece holder through the ribbon ion beam; and a halo bias power supply to bias the electrically conductive frame at a voltage different from a voltage applied to the workpiece holder.

16. The etching system of claim 15, wherein the halo bias power supply is referenced to the workpiece holder so the halo maintains a constant voltage offset from the workpiece holder.

17. The etching system of claim 15, wherein the halo is electrically isolated from the workpiece holder using an insulating material.

18. The etching system of claim 15, wherein the electrically conductive frame is divided into a plurality of conductive regions, wherein a voltage applied to each conductive region is independently controlled.

19. The etching system of claim 15, further comprising a controller in communication with the halo bias power supply, wherein a workpiece type and etching species are input to the controller and the halo bias power supply supplies power to the electrically conductive frame to achieve a desired change in edge etch rate.

* * * * *